United States Patent
Lei et al.

(10) Patent No.: US 11,570,931 B2
(45) Date of Patent: Jan. 31, 2023

(54) VR INTEGRATED MACHINE AND RUNNING METHOD THEREOF

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yu Lei, Beijing (CN); Jian Sun, Beijing (CN); Haoran Jing, Beijing (CN); Wenhong Tian, Beijing (CN); Zhen Tang, Beijing (CN); Ziqiang Guo, Beijing (CN); Xinjian Liu, Beijing (CN); Ruifeng Qin, Beijing (CN); Lili Chen, Beijing (CN); Hao Zhang, Beijing (CN); Feng Pan, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 520 days.

(21) Appl. No.: 16/491,340

(22) PCT Filed: Mar. 29, 2019

(86) PCT No.: PCT/CN2019/080506
§ 371 (c)(1),
(2) Date: Sep. 5, 2019

(87) PCT Pub. No.: WO2019/185036
PCT Pub. Date: Oct. 3, 2019

(65) Prior Publication Data
US 2021/0360818 A1 Nov. 18, 2021

(30) Foreign Application Priority Data
Mar. 30, 2018 (CN) .......................... 201810291333.2

(51) Int. Cl.
*H05K 7/20* (2006.01)
*G02B 27/01* (2006.01)

(52) U.S. Cl.
CPC ....... *H05K 7/2039* (2013.01); *G02B 27/0176* (2013.01)

(58) Field of Classification Search
None
See application file for complete search history.

(56) References Cited

U.S. PATENT DOCUMENTS

| | | | | |
|---|---|---|---|---|
| 6,822,861 B2 * | 11/2004 | Meir | .......................... | G06F 1/20 |
| | | | | 361/679.48 |
| 7,969,738 B2 * | 6/2011 | Koo | .......................... | G06F 1/203 |
| | | | | 136/211 |

(Continued)

FOREIGN PATENT DOCUMENTS

| | | |
|---|---|---|
| CN | 201781448 U | 3/2011 |
| CN | 102437614 A | 5/2012 |

(Continued)

OTHER PUBLICATIONS

First Chinese Office Action dated May 15, 2019.

*Primary Examiner* — Courtney L Smith
(74) *Attorney, Agent, or Firm* — Dilworth & Barrese, LLP.; Michael J. Musella, ESQ.

(57) ABSTRACT

A VR integrated machine and a running method thereof are provided. The VR integrated machine includes a heat generating device, a heat conducting member and thermoelectric conversion member, the heat conducting member is connected with the heat generating device, the thermoelectric conversion member has a first end connected with the (Continued)

heat conducting member, and is configured to generate electrical energy and to supply the electrical energy to the UR integrated machine.

15 Claims, 7 Drawing Sheets

(56) References Cited

U.S. PATENT DOCUMENTS

| | | | | |
|---|---|---|---|---|
| 8,462,499 B2* | 6/2013 | Nishioka | ............... | G06F 1/203 |
| | | | | 174/548 |
| 10,052,985 B2* | 8/2018 | Wolas | ............... | B60N 2/5685 |
| 10,193,046 B2* | 1/2019 | Kaibe | ............... | H02M 3/155 |
| 10,416,735 B2* | 9/2019 | Ali | ............... | G06F 1/203 |
| 10,613,630 B2* | 4/2020 | Omote | ............... | G02B 27/028 |
| 10,785,893 B1* | 9/2020 | Kuo | ............... | G06F 1/206 |
| 2013/0062717 A1* | 3/2013 | Watanabe | ............... | H05K 1/0201 |
| | | | | 257/431 |
| 2014/0070932 A1* | 3/2014 | Prasad | ............... | G02B 27/01 |
| | | | | 340/438 |
| 2015/0155741 A1 | 6/2015 | Li et al. | | |
| 2016/0049108 A1* | 2/2016 | Yajima | ............... | A63F 13/5255 |
| | | | | 345/212 |
| 2018/0074330 A1 | 3/2018 | Callahan | | |
| 2018/0108322 A1* | 4/2018 | Sahin | ............... | G06F 1/28 |
| 2019/0061970 A1* | 2/2019 | Wang | ............... | H02N 11/002 |

FOREIGN PATENT DOCUMENTS

| | | |
|---|---|---|
| CN | 202759400 U | 2/2013 |
| CN | 203119517 U | 8/2013 |
| CN | 104317188 | 1/2015 |
| CN | 204756333 | 11/2015 |
| CN | 105827003 A | 8/2016 |
| CN | 205901408 U | 1/2017 |
| CN | 206834817 U | 1/2018 |
| CN | 108490615 A | 9/2018 |

\* cited by examiner

Generating, by the thermoelectric conversion member, electrical energy by employing heat generated by the heat generating device Supplying the electrical energy to a component in the VR integrated machine

FIG. 8

VR INTEGRATED MACHINE AND RUNNING METHOD THEREOF

TECHNICAL FIELD

The present disclosure relates to a VR integrated machine and a running method thereof.

BACKGROUND

A Virtual Reality (VR) technology is a computer simulation technology that can have a virtual world created and experienced, and use a computer to generate a simulation environment, which is a systematic simulation of multi-source information fusion of interactive three-dimensional dynamic view and physical behavior, so that users are immersed in the environment. Existing VR apparatuses are mainly divided into two types: one is a VR integrated machine in which a mainboard, a battery, a display lens, and other parts and components are all provided in a main body of the apparatus; the other is a VR split machine, in which a processing unit thereof generally employs an external host, a computer with a high-performance processor is usually used, and an entire VR system is powered by an external power source.

Wherein, in order to achieve a good picture effect, the VR integrated machine needs to have a high-performance processor provided to process image information, and the high-performance processor generates a large amount of heat, so that an internal temperature of the VR integrated machine is increased, and meanwhile, the high-performance processor consumes a large amount of electrical energy, resulting in low endurance of the battery carried by the VR integrated machine itself.

SUMMARY

Embodiments of the present disclosure provide a VR integrated machine and a running method thereof.

At a first aspect, an embodiment of the present disclosure provides a VR integrated machine, the VR integrated machine comprises: a heat generating device, a heat conducting member, and thermoelectric conversion member, the heat conducting member is connected with the heat generating device, the thermoelectric conversion member has a first end connected with the heat conducting member, and is configured to generate electrical energy and to supply the electrical energy to the VR integrated machine.

For example, the VR integrated machine provided by an embodiment of the present disclosure further comprises a battery and a charging member, an input end of the charging member is connected with an electrical output end of the thermoelectric conversion member, and an output end of the charging member is connected with the battery.

For example, the VR integrated machine provided by an embodiment of the present disclosure further comprises a voltage regulator, an input end of the voltage regulator is connected with the electrical output end of the thermoelectric conversion member, and an output end of the voltage regulator is connected with an electrical component of the VR integrated machine.

For example, the VR integrated machine provided by an embodiment of the present disclosure further comprises a battery, a charging member and a switching member, an input end of the charging member is connected with the electrical output end of the thermoelectric conversion member, and an output end of the charging member is connected with the battery; the switching member is configured to be coupled between the thermoelectric conversion member and the charging member and between the thermoelectric conversion member and the voltage regulator, so as to switch between the thermoelectric conversion member being coupled to the charging member and the thermoelectric conversion member being coupled to the voltage regulator.

For example, the VR integrated machine provided by an embodiment of the present disclosure further comprises a detector and a controller, the detector is configured to be coupled to the thermoelectric conversion member to detect an output of the thermoelectric conversion member; and the controller is configured to control, according to a detection result of the detector, the switching member to switch between the thermoelectric conversion member being coupled to the charging member and the thermoelectric conversion member being coupled to the voltage regulator.

For example, in the VR integrated machine provided by an embodiment of the present disclosure, the heat conducting member includes a heat conducting part and a heat dissipating part, one end of the heat dissipating part is connected with the heat generating device through the heat conducting part, and the other end of the heat dissipating part is connected with the first end of the thermoelectric conversion member.

For example, in the VR integrated machine provided by an embodiment of the present disclosure, the heat conducting part is any one of a thermal conductive silicone, a thermal conductive insulating plastic, an epoxy resin thermal conductive insulating adhesive and a thermal conductive tape.

For example, in the VR integrated machine provided by an embodiment of the present disclosure, the heat dissipating part is a heat sheet or a heat pipe.

For example, in the VR integrated machine provided by an embodiment of the present disclosure, the heat generating device is one of a processor, an operator and a graphics card or a combination thereof.

For example, in the VR integrated machine provided by an embodiment of the present disclosure, the heat generating device is provided in a main body.

For example, in the VR integrated machine provided by an embodiment of the present disclosure, a cold end of the thermoelectric conversion member is provided at a position of an inner surface of a housing of the VR integrated machine or a main body; a heat dissipation via hole is provided at a position of the housing of the VR integrated machine or the main body which corresponds to the cold end of the thermoelectric conversion member.

For example, in the VR integrated machine provided by an embodiment of the present disclosure, the cold end of the thermoelectric conversion member is provided outside the housing of the VR integrated machine or outside the housing of the main body.

For example, in the VR integrated machine provided by an embodiment of the present disclosure, a surface of the cold end of the thermoelectric conversion member is provided with an anti-corrosion film layer.

For example, in the VR integrated machine provided by an embodiment of the present disclosure, the cold end of the thermoelectric conversion member is covered with a metal mesh cover.

For example, in the VR integrated machine provided by an embodiment of the present disclosure, the thermoelectric conversion member includes a plurality of thermoelectric conversion cells; and the plurality of thermoelectric conversion cells are arranged in an array in the VR integrated machine.

For example, in the VR integrated machine provided by an embodiment of the present disclosure, thermoelectric conversion cells in each row are sequentially connected in series to form a thermoelectric conversion cell group; and all of the thermoelectric conversion cell groups are connected together in parallel.

For example, the VR integrated machine provided by an embodiment of the present disclosure further comprises a boosting member, an input end of the boosting member is connected with the electrical output end of the thermoelectric conversion member, and an output end of the boosting member is connected with the input end of the charging member.

At a second aspect, an embodiment of the present disclosure provides a running method of the VR integrated machine according to the first aspect, comprises: generating, by the thermoelectric conversion member, electrical energy by employing heat generated by the heat generating device; and supplying the electrical energy to a component in the VR integrated machine.

For example, in the running method of the VR integrated machine provided by an embodiment of the present disclosure, the VR integrated machine comprises: a battery; and a charging member, an input end of the charging member being connected with an electrical output end of the thermoelectric conversion member, and an output end of the charging member being connected with the battery, the supplying the electrical energy to the component in the VR integrated machine includes supplying the electrical energy to the battery.

For example, in the running method of the VR integrated machine provided by an embodiment of the present disclosure, the VR integrated machine comprises: a voltage regulator, an input end of the voltage regulator being connected with the electrical output end of the thermoelectric conversion member, and an output end of the voltage regulator being connected with an electrical component of the VR integrated machine; a battery; a charging member, an input end of the charging member being connected with the electrical output end of the thermoelectric conversion member, and an output end of the charging member being connected with the battery; and a switching member, configured to be coupled between the thermoelectric conversion member and the charging member and between the thermoelectric conversion member and the voltage regulator, so as to switch between the thermoelectric conversion member being coupled to the charging member and the thermoelectric conversion member being coupled to the voltage regulator;

the supplying the electrical energy to the component in the VR integrated machine, includes: detecting an output of the thermoelectric conversion member; judging whether the output satisfies a working parameter of the electrical component of the VR integrated machine; if the output satisfies a working parameter of the electrical component of the VR integrated machine, supplying the electrical energy to the voltage regulator in the VR integrated machine; if the output does not satisfy a working parameter of the electrical component of the VR integrated machine, supplying the electrical energy to the charging member in the VR integrated machine; or, the supplying the electrical energy to the component in the VR integrated machine, includes: supplying the electrical energy to the voltage regulator in the VR integrated machine; monitoring the output of the thermoelectric conversion member in real time, and if the output does not satisfy the working parameter of the electrical component of the VR integrated machine, switching to supply the electrical energy to the charging member in the VR integrated machine.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 8 is a flow chart of a running method of a VR integrated machine provided by an embodiment of the present disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Hereinafter, a VR integrated machine proposed by the present disclosure will be described in detail in conjunction with the accompanying drawings.

Heat dissipation performed on the VR integrated machine may be natural air cooling or heat dissipation with a heat sink combined with a cooling fan. In the two heat dissipation modes, the former heat dissipation mode is slow, with a poor heat dissipation effect; the latter heat dissipation mode generates a certain noise due to operation of the fan, which affects a use effect of the VR integrated machine; and with respect to a problem of battery endurance, it is usually solved by increasing battery capacity; however, a large-capacity battery needs to occupy large space of the VR integrated machine, and increase weight of the VR integrated machine, which has a great impact on user experience.

Figure 1:
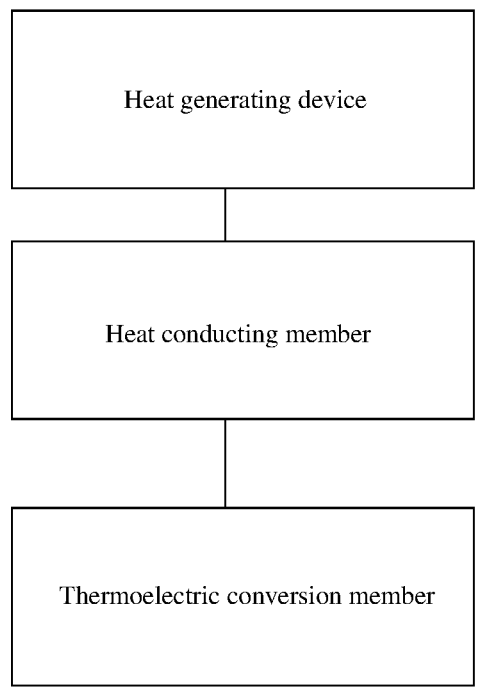
FIG. 1 is a structural schematic diagram of a VR integrated machine provided by an embodiment of the present disclosure.

As shown in FIG. 1, a VR integrated machine proposed by an embodiment of the present disclosure, comprises: a heat generating device 2; a heat conducting member 3, the heat conducting member 3 being connected with the heat generating device 2; and a thermoelectric conversion member 4, the thermoelectric conversion member 4 having a first end connected with the heat conducting member 3, and configured to generate electrical energy and to supply the electrical energy to the VR integrated machine.

Figure 2:
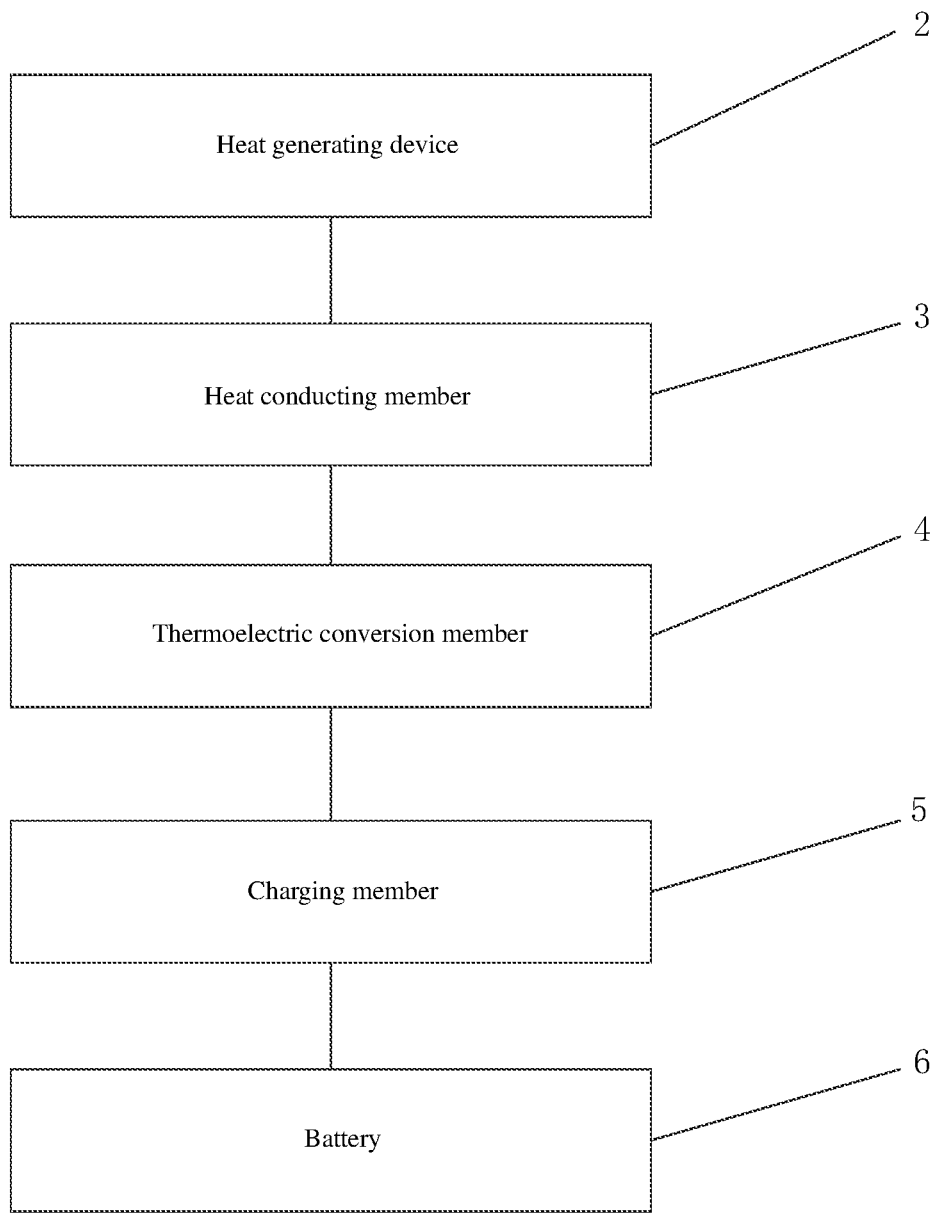
FIG. 2 is a structural schematic diagram of another VR integrated machine provided by an embodiment of the present disclosure.

For example, as shown in FIG. 2, a VR integrated machine according to an embodiment of the present disclosure further comprises: a battery 6; and a charging member 5, an input end of the charging member 5 being connected with an electrical output end of the thermoelectric conversion member 4, and an output end of the charging member 5 being connected with the battery 6.

Figure 3:
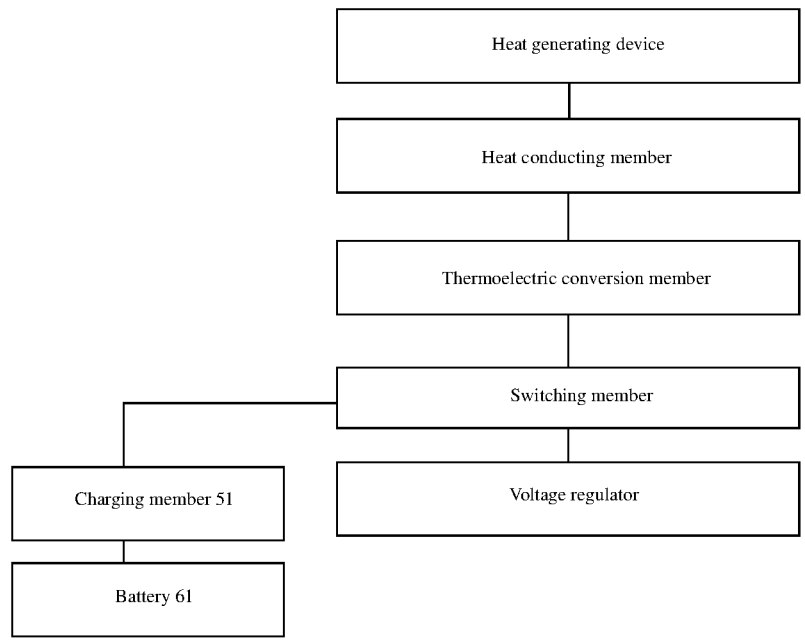
FIG. 3 is a structural schematic diagram of still another VR integrated machine provided by an embodiment of the present disclosure.

For example, as shown in FIG. 3, a VR integrated machine according to an embodiment of the present disclosure further comprises: a voltage regulator 8, an input end of the voltage regulator 8 being connected with the electrical output end of the thermoelectric conversion member 4, an output end of the voltage regulator 8 being connected with an electrical component of the VR integrated machine; a battery 61; a charging member 51, an input end of the charging member 51 being connected with the electrical output end of the thermoelectric conversion member 4, and an output end of the charging member 51 being connected with the battery 61; and a switching member 9, configured to be coupled between the thermoelectric conversion member and the charging member and between the thermoelectric conversion member and the voltage regulator, so as to switch between the thermoelectric conversion member being coupled to the charging member and the thermoelectric conversion member being coupled to the voltage regulator.

For example, the voltage regulator may be a linear voltage regulator, which is provided in series or in parallel with the electrical component, and may include: a diode, a resistor, a reference voltage, an error amplifier, or a power transmission element, etc., which will not be limited in the embodiment of the present disclosure, as long as a stable voltage can be supplied to the electrical component in the VR integrated machine, for example, a display screen, a processor, or the like.

Figure 4:
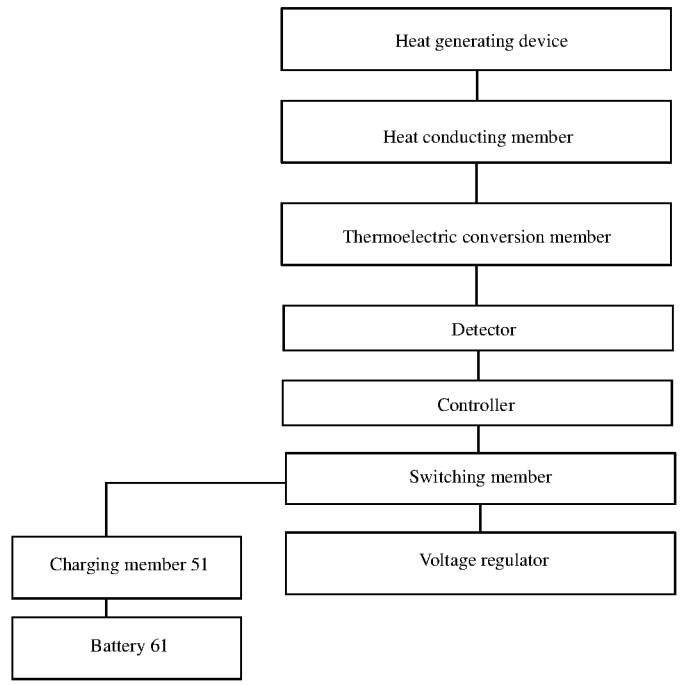
FIG. 4 is a structural schematic diagram of yet another VR integrated machine provided by an embodiment of the present disclosure.

For example, as shown in FIG. 4, a VR integrated machine further comprises: a detector, configured to be coupled to the thermoelectric conversion member to detect an output of the thermoelectric conversion member; and a controller, configured to control, according to a detection result of the detector, the switching member to switch between the thermoelectric conversion member being coupled to the charging member and the thermoelectric conversion member being coupled to the voltage regulator.

For example, the detector may detect an output of the VR integrated machine, for example, a parameter value such as a current or a voltage, and may be a current detector or a voltage detector.

For example, the controller may be a control chip including a processing unit and a storage unit; the storage unit is stored with an instruction; and when the processing unit executes the instruction, the switching member may be controlled to switch between the thermoelectric conversion member being coupled to the charging member and the thermoelectric conversion member being coupled to the voltage regulator.

Figure 5:
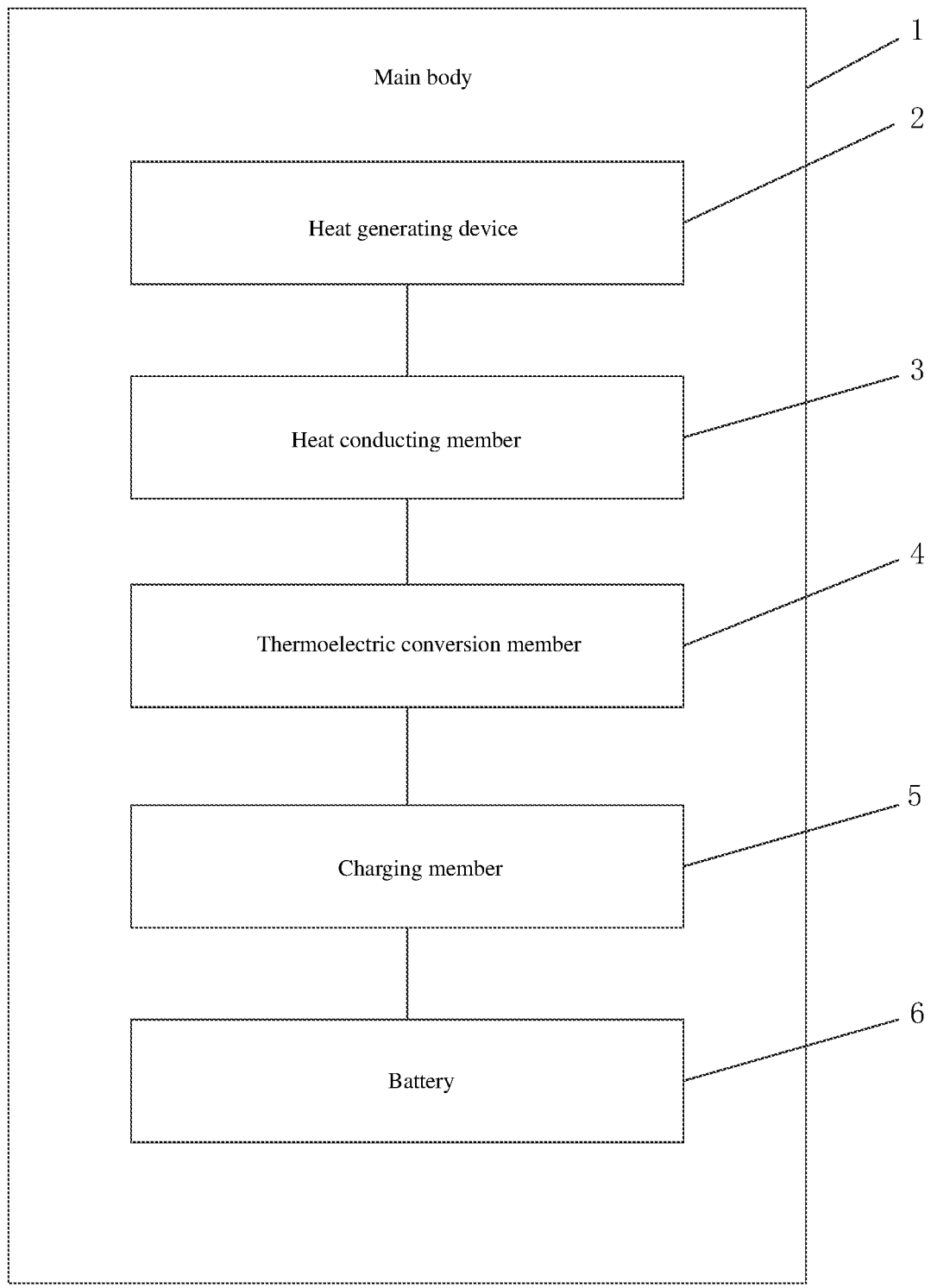
FIG. 5 is a structural schematic diagram of a further VR integrated machine provided by an embodiment of the present disclosure.

For example, in the present disclosure, the heat generating device 2, the heat conducting member 3, the thermoelectric conversion member 4, the charging member 5 and the battery 6 may all be included in a main body 1 of the VR integrated machine, and the main body 1 includes main components of the VR integrated machine, for example, a main processor, a main operator, and so on. As shown in FIG. 5, a VR integrated machine proposed by an embodiment of the present disclosure comprises: a main body 1, a heat conducting member 3, a thermoelectric conversion member 4 and a charging member 5; the heat conducting member 3 is configured to be connected with the heat generating device 2 in the main body 1; a first end of the thermoelectric conversion member 4 is connected with the heat conducting member 3; an input end of the charging member 5 is connected with an electrical output end of the thermoelectric conversion member 4, and an output end of the charging member 5 is connected with the battery 6 in the main body 1.

For example, in an alternative solution, the heat generating device 2, the heat conducting member 3, the thermoelectric conversion member 4, the voltage regulator 8, the battery 61, the charging member 51, the switching member 9, the detector and the controller may be provided in the main body.

For example, the VR integrated machine is an apparatus that is easy to carry and use among existing virtual reality apparatuses, and is characterized in that a host and a display device are arranged together, for example, a head-mounted VR integrated machine. The main body 1 is integration of main functional components of the VR integrated machine, and includes a processing system, a control system, a display system and a sound system, etc., of the VR integrated machine, and may further include other components that assist in implementing functions of the VR integrated machine, for which technologies known to the inventor(s) may be referred to, and no details will be repeated here; however, it should be noted that, the above-described systems and devices are all integrated in a housing of the main body 1, that is, in relatively closed space, wherein, what generate the most heat in the main body 1 are the main processor and other operator or a graphics card, etc. The heat conducting member 3 may be a structural component that can conduct heat quickly, which may be, for example, a heat conducting plate, a heat conducting tube or a heat conducting sheet, for example, heat conducting plates, heat conducting tubes or heat conducting sheets that are arranged in parallel; the heat conducting member 3 may have a structure configured according to an internal space structure of the housing of the main body 1; and the heat conducting member 3 may also have a structure and an arrangement position designed in consideration of factors such as connection with the thermoelectric conversion member and convenience to conduct heat of the heat generating device, which will not be specifically limited in the present disclosure; furthermore, the heat generating device 2 may be the main processor, a secondary processor, the graphics card, the operator or other heat-generating electronic component. The thermoelectric conversion member 4 is a temperature-difference power generating module fabricated by employing a Sebel effect, on a principle that: if two different metal materials are connected together, one metal material thereof has an end portion placed in a high temperature state or a heat source, and the other metal material has an end portion located in an open circuit and located in a low temperature state or a cold end, then an open circuit voltage is present at the cold end, which can be used for converting thermal energy into electrical energy; for example, the thermoelectric conversion member 4 may be a semiconductor temperature-difference power generating module, in which a temperature difference is set between two ends of two semiconductors of different properties, for example, a P-type semiconductor and an N-type semiconductor, so that a direct-current voltage is generated on the semiconductor. The thermoelectric conversion member 4 may be an integral module, or may also be a combination of a plurality of submodules; an exterior of the thermoelectric conversion member needs to be provided with an insulating layer; and a positive electrode and a negative electrode of the electrical output end are set at predetermined positions of the module, wherein, the positive electrode and the negative electrode of the electrical output end are respectively configured to be connected with the positive electrode and the negative electrode of the charging member 5. The charging member 5 needs to be functionally set according to specific power supply requirements of the VR integrated machine, including voltage control, current control, etc.; the charging member 5 may comprise a charging chip and a peripheral circuit; and joints between the charging member 5 and the thermoelectric conversion member 4 and between the charging member 5 and the battery 6 need to be subjected to surface insulation treatment, and sealing and waterproof treatment, specific processing modes of which may be performed by employing technologies known to the inventor(s). In addition, the battery 6 in the main body 1 needs to be a battery 6 that can perform multiple charges and discharges, such as a nickel-cadmium rechargeable battery 6, a nickel-hydrogen rechargeable battery 6, a lithium-ion rechargeable battery 6, a lead-storage rechargeable battery 6, and an iron-lithium rechargeable battery 6, or the like.

In the technical solution of the present disclosure, the VR integrated machine is additionally provided with the heat conducting member and the thermoelectric conversion member, and can conduct heat generated by the heat-generating component, convert thermal energy into electrical energy through the thermoelectric conversion member connected therewith, and finally supply, by the thermoelectric conversion member, the electrical energy generated through conversion to the VR integrated machine. The VR integrated machine may further comprise the charging member, wherein, the thermoelectric conversion member supplies the electrical energy generated through conversion to the charging member, and the charging member charges the battery in the main body. Or the thermoelectric conversion member may directly supply the electrical energy generated through conversion to the electrical component, for example, a display screen, the main processor, or the like. In summary, the VR integrated machine provided by the present disclosure can conduct heat through the heat conducting member, and meanwhile, due to a use characteristic of the thermoelectric conversion member itself, that is, one end thereof is connected with a heat source and the other end is located at a position having a large temperature difference from the heat source, heat conduction may be accelerated, while the thermoelectric conversion member can quickly convert thermal energy into electrical energy, so as to further accelerate heat conduction of the heat generating device, for example, accelerate heat conduction of the main processor, which ensures that the main processor and other electronic component of the VR integrated machine are in a suitable working temperature, enables the VR integrated machine to work with high performance, and brings the user a good experience; in addition, heat generated by the heat generating device in the main body is converted into electrical energy to charge the battery of the VR integrated machine or to be directly supplied to the electrical component therein, which can improve battery endurance without increasing battery capacity to improve battery endurance, so as to avoid the problem of an increased volume of the VR integrated machine due to a larger battery, and at a same time, avoid a weight-gaining problem of the VR integrated machine brought by the large-capacity battery, so that user experience is further improved.

As shown in FIG. 1, the heat conducting member 3 includes a heat conducting part and a heat dissipating part, one end of the heat dissipating part is connected with the heat generating device 2 through the heat conducting part; and the other end of the heat dissipating part is connected with the first end of the thermoelectric conversion member 4.

For example, the heat conducting part may be any one of a thermal conductive silicone, a thermal conductive insulating plastic, an epoxy resin thermal conductive insulating adhesive and a thermal conductive tape, which will not be limited in the present disclosure, as long as it can provide excellent heat conduction performance.

For example, the thermal conductive silicone is a high-end thermal conductive compound, that undergoes condensation reaction with moisture in the air and emits low molecules to cause cross-linking and solidification, to further form a high-performance elastomer with aging resistance performance, electrical insulation performance, excellent resistance to cold and heat alternation, as well as excellent resistance to moisture, shock, corona, electric leakage and chemical medium, which may be used in an environment of $-60°$ C. to $280°$ C. sustainably and maintain performance without swelling, and has good adhesion for most metal and non-metallic materials; it can avoid a risk of short circuit due to its non-solidification and non-conductivity characteristics, so it is suitable for use as a heat-conducting medium between a metal heat dissipating part and the heat generating device 2.

Further, the heat dissipating part is a heat sheet or a heat pipe.

Specifically, the heat sheet may be a heat sheet of a plurality of metal sheets regularly connected together, or may also be specifically configured according to a structure of a heat sheet in technologies known to the inventor(s), and the heat sheet may be made of an aluminum alloy or a copper alloy; similarly, the heat pipe may also be made of an aluminum alloy or a copper alloy, and may be provided on the heat generating device 2 in a form of a coil.

For example, a second end of the thermoelectric conversion member 4 is provided at a position of an inner surface of the housing of the VR integrated machine or the main body; wherein, a heat dissipation via hole is provided at a position where the housing of the main body 1 corresponds to the second end of the thermoelectric conversion member 4.

Both ends of the thermoelectric conversion member 4 need to be respectively provided at the heat source and the cold end, while in the main body 1 of the VR integrated machine, the heat source is just the heat generating device 2, for example, the main processor, and the closer to the housing of the main body 1, the lower the temperature, so the second end of the thermoelectric conversion member 4, that is, the cold end, is provided at the position of the inner surface of the housing of the VR integrated machine or the main body; and in order to further reduce the temperature of the second end of the thermoelectric conversion member 4, the heat dissipation via hole is correspondingly opened on the housing, so that the temperature of the second end of the thermoelectric conversion member 4 is closer to the room temperature.

Alternatively, the cold end of the thermoelectric conversion member is provided outside the housing of the VR integrated machine or outside the housing of the main body.

In a case where no special cooling device is added, with respect to temperatures inside and outside the housing of the VR integrated machine or the main body 1, the temperature outside must be the lowest, so the second end of the thermoelectric conversion member 4 is provided outside the housing of the main body, so that the first end of the thermoelectric conversion member 4, that is, the hot end and the second end has a largest temperature difference therebetween, to facilitate thermoelectric conversion.

Further, since the second end of the thermoelectric conversion member 4 is located outside the housing of the main body 1 or outside the housing of the VR integrated machine, in order to prevent corrosion or damage thereof, a surface of the second end of the thermoelectric conversion member 4 may be provided with an anti-corrosion film layer, and the second end of the thermoelectric conversion member 4 is covered with a metal mesh cover.

Specifically, the anti-corrosion film layer may be a passivation metal layer sprayed on the second end of the thermoelectric conversion member 4, or may also be a layer of plastic material covering the second end of the thermoelectric conversion member 4; the metal mesh cover may be specifically set according to structural features of the second end of the thermoelectric conversion member 4, for example, set to a spherical mesh shape, or set to a rectangular mesh shape, or the like.

Figure 6:
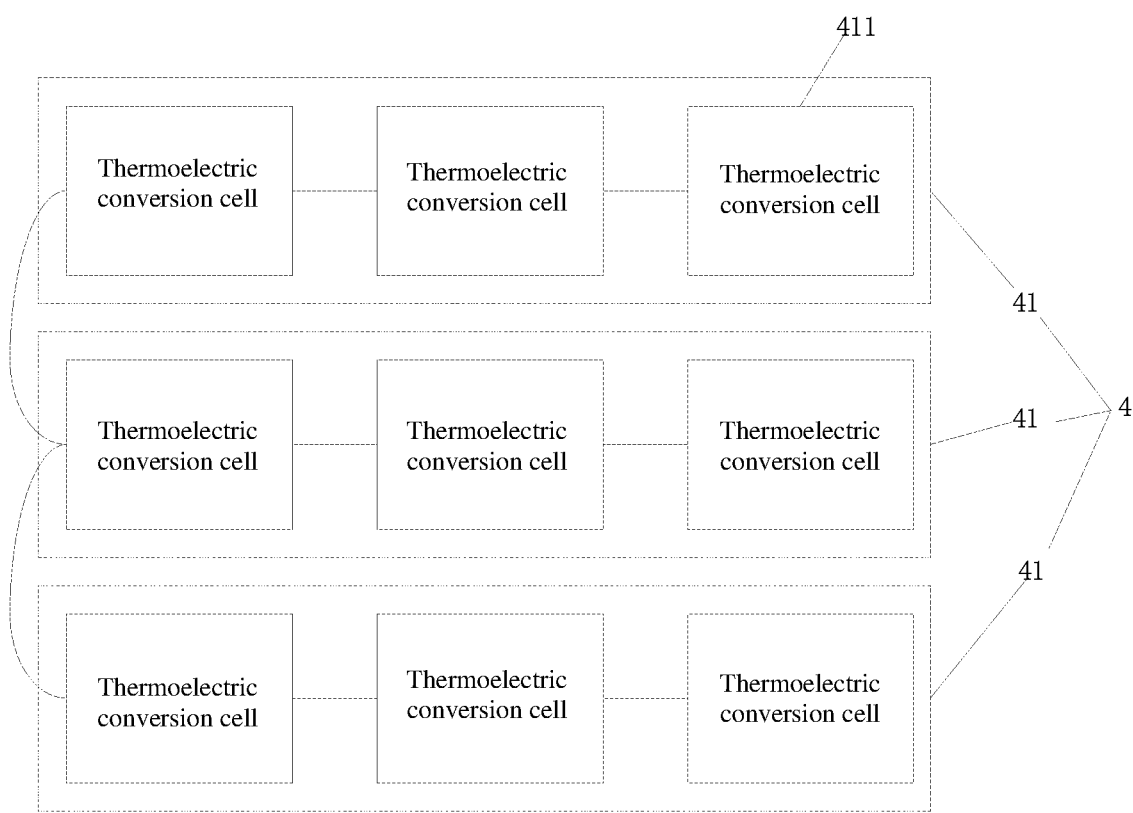
FIG. 6 is a structural schematic diagram of a thermoelectric conversion member of a VR integrated machine provided by an embodiment of the present disclosure.

As shown in FIG. 6, the thermoelectric conversion member 4 includes a plurality of thermoelectric conversion cells 411; wherein, the plurality of thermoelectric conversion cells 411 are arranged in an array in the VR integrated machine, for example, the main body.

For example, since thermoelectric conversion power of a single small-volume thermoelectric conversion cell 411 is too low, and a cost of one large-volume thermoelectric conversion cell 411 is too high, one way is to constitute the thermoelectric conversion member 4 with a plurality of small-volume thermoelectric conversion cells 411, wherein, in order to facilitate connections between the plurality of thermoelectric conversion cells 411 and to occupy the smallest internal space of the main body, the plurality of thermoelectric conversion cells 411 may be arranged in a matrix.

Further, the plurality of thermoelectric conversion cells 411 arranged in a matrix are connected in a mode below:

As shown in FIG. 6, thermoelectric conversion cells 411 in each row are sequentially connected in series to form a thermoelectric conversion cell group 41; and thereafter, all of the thermoelectric conversion cell groups 41 are connected in parallel, that is, each row is connected in series, and a plurality of rows are connected in parallel.

Specifically, an output voltage and an output current of the thermoelectric conversion member may be improved in the above-described mode, and the battery can be quickly charged.

Figure 7:
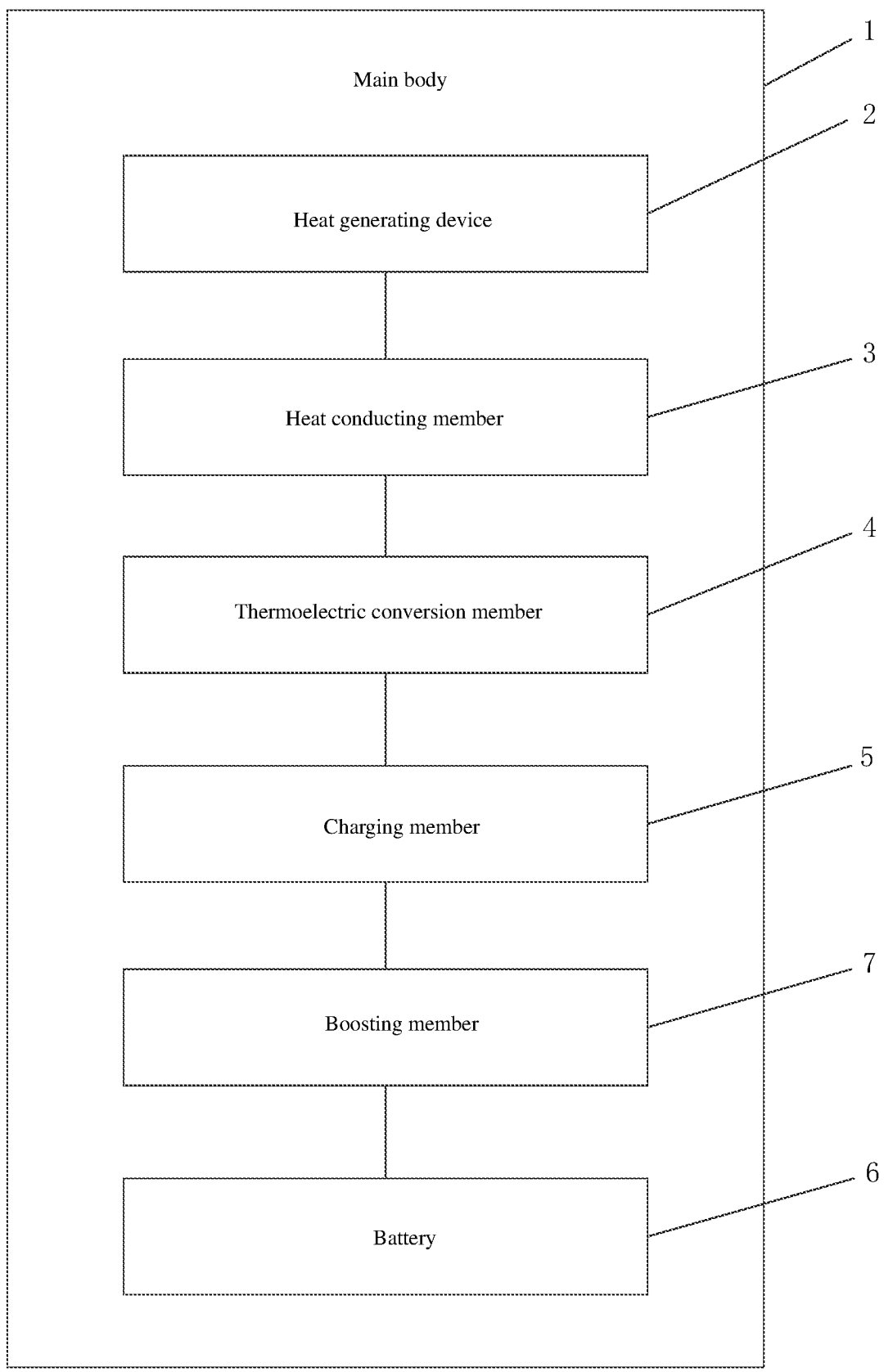
FIG. 7 is a structural schematic diagram of a further VR integrated machine provided by an embodiment of the present disclosure.

As shown in FIG. 7, a VR integrated machine provided by the present disclosure may further comprise: a boosting member 7, an input end of the boosting member 7 being connected with the electrical output end of the thermoelectric conversion member 4, and an output end of the boosting member 7 being connected with the input end of the charging member 5.

The setting of the boosting member can ensure that the thermoelectric conversion member 4 normally charges the battery 6, especially when a voltage generated by the thermoelectric conversion member 4 is insufficient, that is, the heat generating device 2 generates less heat, and the thermoelectric conversion member 4 has a small temperature difference, the boosting member can ensure the battery 6 to be charged normally.

As shown in FIG. 8, the present disclosure further provides a running method of any one of the above-described VR integrated machines, comprising: generating, by the thermoelectric conversion member, electrical energy by employing heat generated by the heat generating device; and supplying the electrical energy to a component in the VR integrated machine.

For example, the VR integrated machine comprises: a battery; and a charging member, an input end of the charging member being connected with an electrical output end of the thermoelectric conversion member, and an output end of the charging member being connected with the battery.

The supplying the electrical energy to a component in the VR integrated machine, includes:

Supplying the electrical energy to the battery.

For example, the VR integrated machine comprises:

A voltage regulator, an input end of the voltage regulator being connected with the electrical output end of the thermoelectric conversion member, and an output end of the voltage regulator being connected with an electrical component of the VR integrated machine;

A battery;

A charging member, the input end of the charging member being connected with the electrical output end of the thermoelectric conversion member, and the output end of the charging member being connected with the battery;

A switching member, configured to be coupled between the thermoelectric conversion member and the charging member and between the thermoelectric conversion member and the voltage regulator, so as to switch between the thermoelectric conversion member being coupled to the charging member and the thermoelectric conversion member being coupled to the voltage regulator;

The supplying the electrical energy to a component in the VR integrated machine, includes:

Detecting an output of the thermoelectric conversion member;

Judging whether the output satisfies a working parameter of the electrical component of the VR integrated machine; if so, supplying the electrical energy to the voltage regulator in the VR integrated machine; if not, supplying the electrical energy to the charging member in the VR integrated machine; or, The supplying the electrical energy to a component in the VR integrated machine, includes:

Supplying the electrical energy to the voltage regulator in the VR integrated machine;

Monitoring the output of the thermoelectric conversion member in real time, and if the output does not satisfy the working parameter of the electrical component of the VR integrated machine, switching to supply the electrical energy to the charging member in the VR integrated machine.

In the embodiment of the present disclosure, the VR integrated machine is additionally provided with the heat conducting member and the thermoelectric conversion member, and can conduct heat generated by the heat-generating component when the VR integrated machine is running, convert thermal energy into electrical energy through the thermoelectric conversion member connected therewith, and finally supply, by the thermoelectric conversion member, the electrical energy generated through conversion to the VR integrated machine. The VR integrated machine may further comprise the charging member, the thermoelectric conversion member supplies the electrical energy generated through conversion to the charging member, and the charging member charges the battery in the main body; or the thermoelectric conversion member may directly supply the electrical energy generated through conversion to the electrical component, for example, a display screen, the main processor, or the like. In summary, in the running method of the VR integrated machine provided by the present disclosure, heat can be conducted through the heat conducting member, and meanwhile, due to a use characteristic of the thermoelectric conversion member itself, that is, one end thereof is connected with a heat source and the other end is located at a position having a large temperature difference from the heat source, heat conduction may be accelerated, while the thermoelectric conversion member can quickly convert thermal energy into electrical energy, so as to further accelerate heat conduction of the heat generating device, for example, accelerate heat conduction of the main processor, which ensures that the main processor and other electronic component of the VR integrated machine are in a suitable working temperature, enables the VR integrated machine to work with high performance, and brings the user a good experience; in addition, heat generated by the heat generating device in the main body is converted into electrical energy to charge the battery of the VR integrated machine or to be directly supplied to the electrical component therein, which can improve battery endurance without increasing battery capacity to improve battery endurance, so as to avoid the problem of an increased volume of the VR integrated machine due to a larger battery, and at a same time, avoid a weight-gaining problem of the VR integrated machine brought by the large-capacity battery, so that user experience is further improved.

In the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, a thickness of a layer or a region may be enlarged or shortened, that is, the accompanying drawings are not drawn according to the actual scale.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The application claims priority to the Chinese patent application No. 201810291333.2, filed Mar. 30, 2018, the disclosure of which is incorporated herein by reference as part of the application.

The invention claimed is:

1. A VR integrated machine, comprising:
   a heat generating device;
   a heat conducting member, the heat conducting member being connected with the heat generating device;
   a thermoelectric conversion member, the thermoelectric conversion member having a first end connected with the heat conducting member, and configured to generate electrical energy and to supply the electrical energy to the VR integrated machine,
   wherein the VR integrated machine further comprising:
   a voltage regulator, an input end of the voltage regulator being connected with the electrical output end of the thermoelectric conversion member, and an output end of the voltage regulator being connected with an electrical component of the VR integrated machine, the electrical component comprises a display screen and a processor,
   a battery;
   a charging member, an input end of the charging member being connected with the electrical output end of the thermoelectric conversion member, and an output end of the charging member being connected with the battery; and
   a switching member, configured to be coupled between the thermoelectric conversion member and the charging member and between the thermoelectric conversion member and the voltage regulator, so as to switch between the thermoelectric conversion member being coupled to the charging member and the thermoelectric conversion member being coupled to the voltage regulator.

2. The VR integrated machine according to claim 1, further comprising:
   a detector, configured to be coupled to the thermoelectric conversion member to detect an output of the thermoelectric conversion member; and
   a controller, configured to control, according to a detection result of the detector, the switching member to switch between the thermoelectric conversion member being coupled to the charging member and the thermoelectric conversion member being coupled to the voltage regulator.

3. The VR integrated machine according to claim 1, wherein the heat conducting member includes a heat conducting part and a heat dissipating part, one end of the heat dissipating part is connected with the heat generating device through the heat conducting part, and the other end of the heat dissipating part is connected with the first end of the thermoelectric conversion member.

4. The VR integrated machine according to claim 3, wherein the heat conducting part is any one of a thermal conductive silicone, a thermal conductive insulating plastic, an epoxy resin thermal conductive insulating adhesive and a thermal conductive tape.

5. The VR integrated machine according to claim 3, wherein the heat dissipating part is a heat sheet or a heat pipe.

6. The VR integrated machine according to claim 1, wherein the heat generating device is one of a processor, an operator and a graphics card or a combination thereof.

7. The VR integrated machine according to claim 6, wherein the heat generating device is provided in a main body.

8. The VR integrated machine according to claim 1, wherein a cold end of the thermoelectric conversion member is provided at a position of an inner surface of a housing of the VR integrated machine or a main body;
a heat dissipation via hole is provided at a position of the housing of the VR integrated machine or the main body which corresponds to the cold end of the thermoelectric conversion member.

9. The VR integrated machine according to claim 1, wherein the cold end of the thermoelectric conversion member is provided outside the housing of the VR integrated machine or outside the housing of the main body.

10. The VR integrated machine according to claim 1, wherein
a surface of the cold end of the thermoelectric conversion member is provided with an anti-corrosion film layer.

11. The VR integrated machine according to claim 1, wherein
the cold end of the thermoelectric conversion member is covered with a metal mesh cover.

12. The VR integrated machine according to claim 1, wherein the thermoelectric conversion member includes a plurality of thermoelectric conversion cells; and
the plurality of thermoelectric conversion cells are arranged in an array in the VR integrated machine.

13. The VR integrated machine according to claim 12, wherein thermoelectric conversion cells in each row are sequentially connected in series to form a thermoelectric conversion cell group; and
all of the thermoelectric conversion cell groups are connected together in parallel.

14. The VR integrated machine according to claim 1, further comprising:
a boosting member, an input end of the boosting member being connected with the electrical output end of the thermoelectric conversion member, and an output end of the boosting member being connected with the input end of the charging member.

15. A running method of the VR integrated machine according to claim 1, comprising:
generating, by the thermoelectric conversion member, electrical energy by employing heat generated by the heat generating device; and
supplying the electrical energy to a component in the VR integrated machine,
wherein the supplying the electrical energy to the component in the VR integrated machine, includes:
detecting an output of the thermoelectric conversion member;
judging whether the output satisfies a working parameter of the electrical component of the VR integrated machine; if the output satisfies a working parameter of the electrical component of the VR integrated machine, supplying the electrical energy to the voltage regulator in the VR integrated machine; if the output does not satisfy a working parameter of the electrical component of the VR integrated machine, supplying the electrical energy to the charging member in the VR integrated machine; or,
the supplying the electrical energy to the component in the VR integrated machine, includes:
supplying the electrical energy to the voltage regulator in the VR integrated machine;
monitoring the output of the thermoelectric conversion member in real time, and if the output does not satisfy the working parameter of the electrical component of the VR integrated machine, switching to supply the electrical energy to the charging member in the VR integrated machine.

* * * * *